(12) United States Patent
Morrell

(10) Patent No.: US 6,268,728 B1
(45) Date of Patent: Jul. 31, 2001

(54) PHASE-SENSITIVE METHOD OF RADIO-FREQUENCY FIELD MAPPING FOR MAGNETIC RESONANCE IMAGING

(75) Inventor: Glen Morrell, Palo Alto, CA (US)

(73) Assignee: Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/247,447

(22) Filed: Feb. 10, 1999

(51) Int. Cl.[7] ........................................ G01V 3/00
(52) U.S. Cl. ...................................... 324/307
(58) Field of Search ........................ 324/307, 309, 324/312

(56) References Cited

U.S. PATENT DOCUMENTS

| | | | |
|---|---|---|---|
| 5,105,152 | * | 4/1992 | Pauly ............................ 324/309 |
| 5,126,671 | * | 6/1992 | Bodenhausen et al. ........... 324/309 |
| 5,196,795 | * | 3/1993 | Bodenhausen et al. ........... 324/309 |
| 5,448,170 | * | 9/1995 | Bodenhausen et al. ........... 324/309 |

* cited by examiner

*Primary Examiner*—Christine Oda
*Assistant Examiner*—Dixomara Vargas
(74) *Attorney, Agent, or Firm*—Townsend and Townsend and Crew LLP; Henry K. Woodward

(57) ABSTRACT

Inhomogeneity of the radio-frequency (RF) field $B_1$ interferes with imaging methods such as fat saturation which are sensitive to variations in the tip angle achieved by an RF pulse. In addition, in the common case in which the MR signal is received through the same coil used for excitation, the RF field is a measure of the receiver coil sensitivity. If the RF field can be measured, RF pulses could be designed specifically to counteract the inhomogeneity of the RF field. Additionally, maps of the RF field could be used as coil sensitivity maps, which may be used for image intensity correction. A phase-sensitive method of $B_1$ mapping is presented which is applicable over a wide range of RF inhomogeneity corresponding to flip angles ranging from about 45 to 135 degrees. This method requires two or three acquisitions in addition to the acquisition of a main-field ($B_0$) field map.

9 Claims, 7 Drawing Sheets

PHASE-SENSITIVE METHOD OF RADIO-FREQUENCY FIELD MAPPING FOR MAGNETIC RESONANCE IMAGING

The U.S. Government has rights in this invention pursuant to NIH Contracts CA-48269 and NCRR-09784 and NIGMS Contract ST 32-GM07365 with Stanford University.

BACKGROUND OF THE INVENTION

This invention relates generally to magnetic resonance imaging; and more particularly the invention relates to a method of mapping the $B_1$ radio frequency field used in nuclei spin excitation.

Inhomogeneity of the radio-frequency (RF) field $B_1$ interferes with many imaging methods, particularly those sensitive to flip angle such as fat saturation. Adiabatic excitation pulses are often used to overcome the effects of $B_1$ inhomogeneity, at the cost of increased excitation time and considerably increased pulse power.

With a map of the $B_1$ field over an imaging plane, multi-dimensional pulses could be designed to compensate for $B_1$ inhomogeneity without the increased power requirements of adiabatic pulses. Since the $B_1$ field achieved by a coil during excitation is also the sensitivity of the coil during reception, a map of the $B_1$ field serves also as a map of coil sensitivity, which can be used for image intensity correction for scans utilizing a surface coil. Efforts have been made to correct image intensity with a theoretical $B_1$ map calculated from coil geometry. In practice, factors such as coil imperfections and body geometry with locally varying complex dielectric constants may cause the actual $B_1$ field to vary from its calculated ideal configuration.

Several methods of $B_1$ mapping have been suggested. The simplest involves filling the entire imaging volume with a uniform water-filled sample, performing a simple imaging sequence, and interpreting the magnitude of the resulting image as a map of sin α, where α is the flip angle and thus a measure of the $B_1$ field. This method is subject to error from any factor other than $B_1$ homogeneity that causes variation in the magnitude of the received image. This method also has very poor SNR characteristics for flip angles around 90°, since the derivative $d|M_{xy}|/d\alpha$ of the magnitude $M|xy|$ of transverse magnetization with respect to flip angle α is zero for α=90°. The derivative $d|M_{xy}|/d\alpha$ is maximum at α=0, but at this point the signal is zero.

Similarly, an imaging experiment may be repeated many times, changing the transmit gain of the RF amplifier with each repetition. The image in which a given voxel achieves its maximum magnitude corresponds to the transmit gain which most nearly produced a 90° flip angle in that voxel. This method removes the effects of factors other than $B_1$ inhomogeneity affecting image magnitude, but has the same SNR disadvantage as the previous method and requires many scans to achieve reasonable accuracy.

A similar method prepends a large-flip-angle pulse (nominally α=360°) to a fast gradient-recalled echo (GRE) imaging sequence, varying the intensity of the pulse with successive scans. The magnitude of the image obtained is a function of the longitudinal magnetization $M_z$ remaining after the α pulse, and is maximum when α=360°. However, since $M_z$ α cos α, the derivative $d|M_{xy}|/d\alpha$ of the magnitude $M|_{xy}|$ of the traverse magnetization with respect to the flip angle α of the prepended pulse is zero for α=360°, so this method suffers from the same SNR disadvantage as the previous two methods.

Oh et al *Radio frequency field intensity mapping using a composite spin-echo sequence,* Magn. Reson. Imaging 8, 21–25 (1990) proposed a phase-sensitive method of $B_1$ mapping that uses a slice-selective 90° excitation followed by a non-selective $90°_x$–$180°_y$–$90°_x$ composite pulse. They showed that if only the 180° part of the composite pulse is subject to $B_1$ inhomogeneity, the resulting transverse magnetization has a phase which is a function of the actual flip angle achieved by the $180°_y$ portion of the composite pulses. Their analysis assumed that the three 90° pulses in the sequence were unaffected by $B_1$ inhomogeneity. They also addressed main field ($B_0$) inhomogeneity but assumed that this inhomogeneity was in effect only for the duration of the composite pulse, and neglected phase accrual due to inhomogeneity between the initial slice-selective 90° pulse and the composite pulse. Unfortunately, when such phase accrual is factored in and all RF pulses in the sequence are made subject to the same $B_1$ inhomogeneity, the phase of the resulting signal is no longer a single-valued function of $B_1$. In addition, since the composite pulse is not slice-selective, and since the $90°_x$ elements of this pulse are subject to $B_1$ inhomogeneity just as the $180°_y$ element is, the out-of-slice signal generated by the composite pulse is potentially many times greater than the desired in-slice signal.

Insko et al. *Mapping of the radiofrequency field,* J. Magn. Reson. 103. 82–85 (June 1993) have described a method employing the ratio of acquisitions following α-τ-2α and 2α-τ-4α spin-echo excitations. The resulting ratio is a function of the actual flip angles achieved. This method has the advantage of being insensitive to main field $B_0$ inhomogeneity. However, it is suitable for use over only a small range of tip angles, over which it has good sensitivity. Insko also proposed a variation of this technique in which the ratio of two gradient-echo acquisitions is obtained, with the idea that this method may be more suitable for a wider range of flip angles.

Topp et al. *Fast multislice $b_1$-mapping,* in "Proc., ISMRM, 5th Annual Meeting, Vancouver, April 1997," p.281, has recently suggested a method of $B_1$ mapping with stimulated echoes formed by a slice-selective 90° pulse which is followed by a large dephasing gradient lobe. A subsequent 90° pulse encodes the resulting dephased transverse magnetization in the $\hat{z}$ axis. A non-selective pulse is then applied which has a nominal tip angle of θ, followed by another 90° tip and rephasing lobe which create a stimulated echo from the dephased magnetization stored in $\hat{z}$. The magnitude of the signal obtained is proportional to cos θ. This sequence is repeated four times, with nominal values of θ=0°, 100°, 200°, and 300°. A best fit of cos θ to the magnitude of the four actual acquisitions is calculated by a least-squares non-linear curve fitting algorithm.

We propose a phase-sensitive method of $B_1$ mapping which has good signal-to-noise (SNR) properties over a wide range of $B_1$ inhomogeneity corresponding to flip angles between 35° and 145°. This method may be suitable for mapping the wide variability of RF field strength and coil sensitivity encountered when surface coils are used for excitation and/or readout.

SUMMARY OF THE INVENTION

The present invention provides a phase sensitive method of $B_1$ mapping which is applicable over a wide range of RF inhomogeneity corresponding to flip angles ranging from about 45 to 135 degrees. The preferred embodiment requires three acquisitions in addition to the acquisition of a main-field ($B_0$) field map.

The invention includes use of a $2\alpha$ excitation pulse about the $\hat{x}$ axis, followed by an $\alpha$ excitation pulse about the $\hat{y}$ axis, where $\alpha$ is nominally 90° but varies as a result of $B_1$ inhomogeneity. The phase of the resulting transverse magnetization $M_{xy}$ is a sensitive function of the actual flip angle $\alpha$ over a range of about 35° to 145°.

The invention is useful over a wider range of variation in the RF field than most other methods of RF field mapping and has good signal-to-noise characteristics.

The invention can be implemented in a slice-selective manner rather than three-dimensional volumetric manner. If only fat or only water is present in the object to be imaged, the method can be implemented with two acquisitions instead of three. This is done by making the excitation pulses as brief as possible and as closely spaced together as possible, thus giving good measurement of the RF field over a wide range of main field ($B_0$) inhomogeneity with only one phase acquisition and one reference acquisition. In objects with both fat and water present, an inversion-recovery pulse can be prepended to the pulse sequence to suppress fat or water, allowing a two-excitation technique to be used. If two excitations are used instead of three, the technique has a significant scan time advantage over known prior art.

The invention and objects and features thereof will be more readily apparent from the following detailed description and appended claims when taken with the drawings.

DETAILED DESCRIPTION OF ILLUSTRATIVE EMBODIMENTS

Figure 1A:
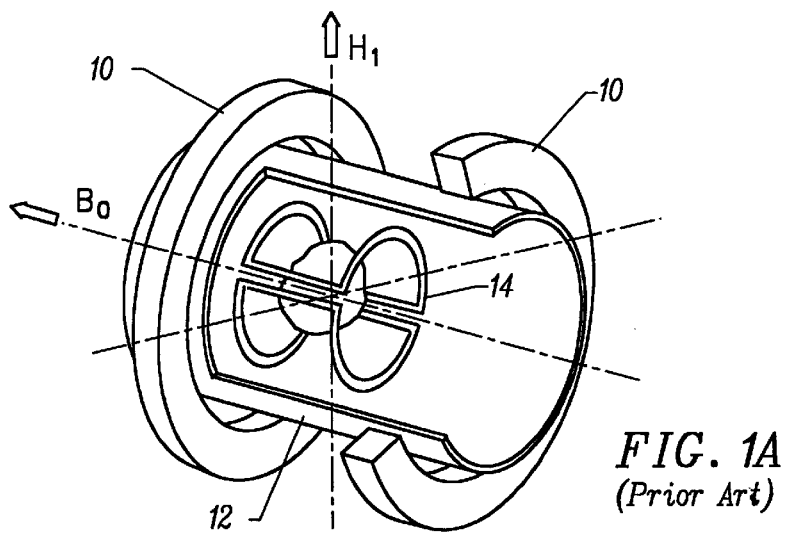
FIGS. 1A–1D illustrate the arrangement of conventional MRI apparatus and magnetic fields generated therein.
Figure 1B:
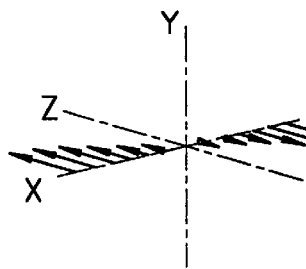
Figure 1C:
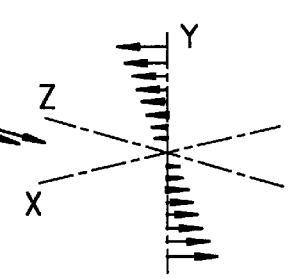
Figure 1D:
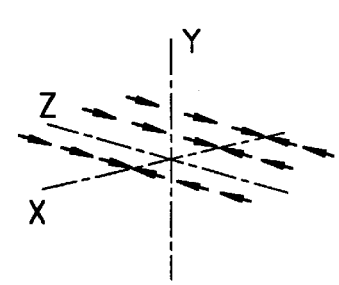

Referring now to the drawings, FIG. 1A is a perspective view partially in section illustration coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_0$ is generated by the magnet comprising the coil pair 10. A gradient $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y and Z axes. FIGS. 1C and 1D are similar representations of the Y gradient and Z gradient fields, respectively.

Figure 2:
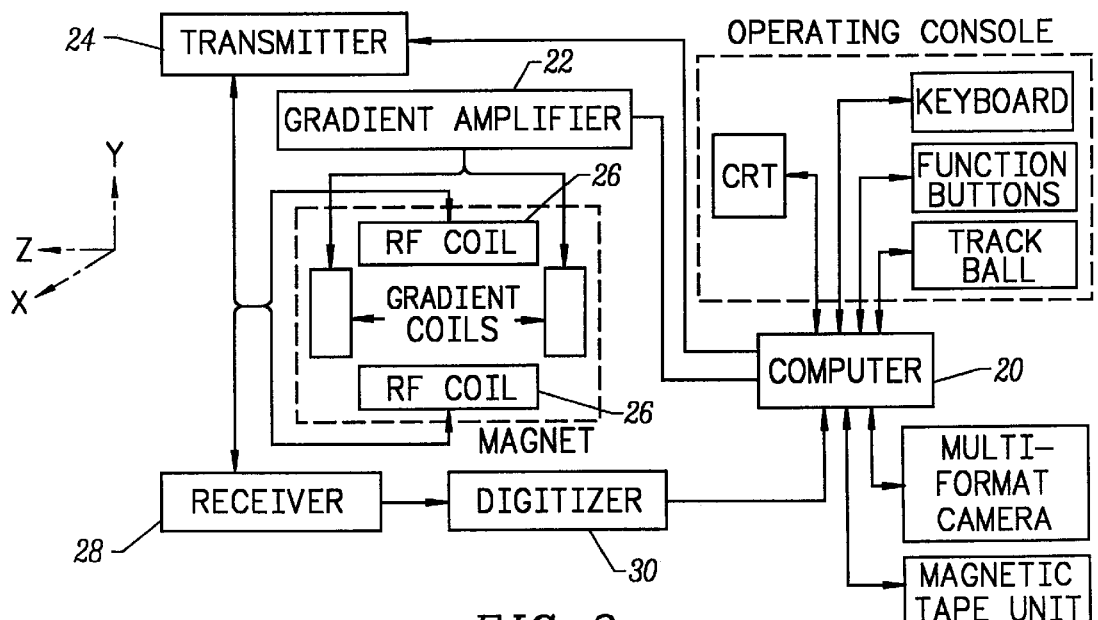
FIG. 2 is a functional block diagram of MRI imaging.

FIG. 2 is a functional block diagram of the imaging apparatus as disclosed in *NMR—A Perspective on Imaging*, General Electric Company. A computer 20 is programmed to control the operation of the NMR apparatus and process free induction decay (FID) signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

As noted above, inhomogeneity of the radio-frequency (RF) field $B_1$ interferes with imaging methods such as fat saturation which are sensitive to variations in the tip angle achieved by an RAF pulse. In addition, in the common case in which the MR signal is received through the same coil used for excitation, the RF field is a measure of the receiver coil sensitivity. If the RF field can be measured, RF pulses could be designed specifically to counteract the inhomogeneity of the RF field. Additionally, maps of the RF field could be used as coil sensitivity maps, which may be used for image intensity correction.

In accordance with the invention, a phase-sensitive method of $B_1$ mapping is presented which is applicable over a wide range of RF inhomogeneity corresponding to flip angles ranging from about 45 to 135 degrees. The preferred embodiment requires three acquisitions in addition to the acquisition of a main-field ($B_0$) field map. However, if only fat or only water is present in the object to be imaged, the method can be implemented with two acquisitions instead of three. This is done by making the excitation pulses as brief as possible and as closely spaced together as possible, thus giving good measurement of the RF field over a wide range of main field ($B_0$) inhomogeneity with only one phase acquisition and one reference acquisition. In objects with both fat and water present, an inversion-recovery pulse can be prepended to the pulse sequence to suppress fat or water, allowing a two-excitation technique to be used. If two excitations are used instead of three, the technique has a significant scan time advantage over the known prior art. The invention can be implemented in a slice-selective manner rather than three-dimensional volumetric manner.

For the analysis presented below, the two excitation pulses are considered to have zero duration and to be separated in time by an interval τ.

Assuming an initial longitudinal magnetization $M_z(0)=1$ with zero transverse magnetization $M_x(0)=0$ and $M_y(0)=0$ in the x and y directions respectively, we apply a left-handed tip with flip angle $2\alpha$ about the $\hat{x}$ axis, giving magnetization:

$M_x=0$
$M_y=\sin 2\alpha$
$M_z=\cos 2\alpha$

Figure 3A:
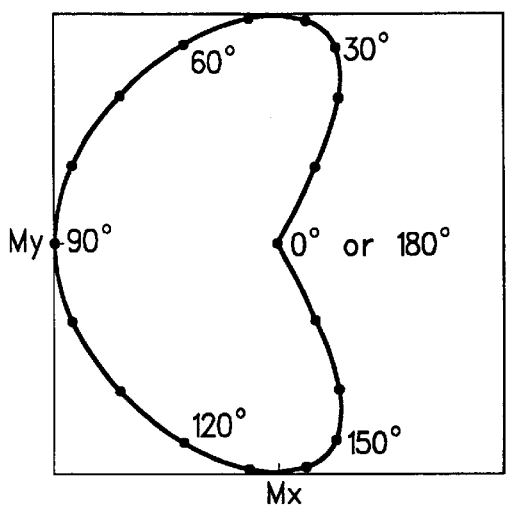
FIGS. 3A, 3B illustrate theoretical transverse magnetization for precession of θ° from −80° to +80° and for a range of flip angle α from 0 to 180°.
Figure 3B:
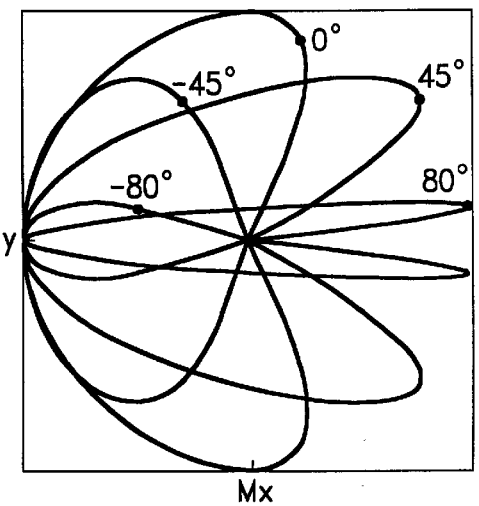

The $2\alpha$ flip is followed by an interval $\tau$ during which the transverse magnetization precesses by an angle $\theta=\tau\omega$ where $\omega$ is the off-resonant frequency of the spins due to chemical shift, poor center frequency calibration, etc. During this interval, the transverse magnetization also decays by a factor $d_2=\exp(-\tau/T_2)$ and the longitudinal magnetization $M_z$ increases by the amount $d_1(1-M_z)$ where $d_1=(1-\exp(-\tau/T_1))$. The resulting magnetization at the end of interval $\tau$ is therefore:

$M_x=d_2 \sin 2\alpha \sin \theta$
$M_y=d_1 \sin 2\alpha \cos \theta$
$M_z=\cos 2\alpha+d_1(1-\cos 2\alpha)$ Now applying a left-handed tip of angle $\alpha$ about the $-\hat{y}$ axis, we have the final magnetization:

$M_x=d_2 \sin 2\alpha \cos \alpha \sin \theta+\sin \alpha(\cos 2\alpha+d_1 (1-\cos 2\alpha))$
$M_y=d_2 \sin 2\alpha \cos \theta$
$M_z=\cos \alpha(\cos 2\alpha+d_1 (1-\cos 2\alpha))-d_2 \sin 2\alpha \sin \alpha \cos \theta$ If we assume that $d_1=0$ and $d_2=1$, i.e. the interval $\tau$ is short enough that $T_1$ and $T_2$ effects are negligible, then $M_x=\sin 2\alpha \cos \alpha \sin \theta+\sin \alpha \cos 2\alpha$
$M_y=\sin 2\alpha \cos \theta$
$M_z=\cos 2\alpha \cos \alpha-\sin 2\alpha \sin \alpha \cos \theta$ The transverse magnetization $M_{xy}=M_x+iM_y$ given in the above equations is plotted in FIG. 3A for $\alpha$ ranging from 0° to 180° and $\theta=0°$, and in FIG. 3B for $\alpha$ from 0° to 180° for a few values of $\theta$ between −80° and 80°. FIG. 3 illustrates $M_{xy}$ only for values of $\theta$ between −90° and 90°. In FIG. 3A theoreical transverse magnetization is for $\theta=0°$ with discrete points plotted at 10° increments of $\alpha$, and in FIG. 3B, $\theta$ ranges from −80° to 80° with discrete points plotted for $\alpha=30°$. For values of $\theta$ between 90° and 270°, $M_{xy}$ is the same as for $\theta$ between −90° and 90°, flipped about the $\hat{x}$ axis. For values of $\theta$ around 0°, the angle $\beta=\tan^{-1}(M_y/M_x)$ is a sensitive function of $\alpha$ for values of $\alpha$ from about 30° to 150°. As $\theta$ approaches −90° or 90°, $\beta$ becomes a less useful measure of the flip angle $\alpha$. However, if the $B_1$ mapping sequence is repeated with the transmit and receive frequencies offset by a frequency $f_{off}$ such that $f_{off}\tau=90°$, then $\beta$ becomes a good function of $\alpha$ for $\theta$ from 45° to 135° and from 225° to 315°. Thus with these two measurements of $M_{xy}$ and one measurement of $\theta$, obtained by a field-mapping sequence, $\alpha$ may be determined for any value of $\theta$. In practice, a third acquisition is also acquired following a single 90° excitation to establish a phase reference that can be subtracted from the first two measurements of $M_{xy}$ to remove phase effects due to eddy currents, data acquisition delays, high dielectric constants, etc.

Figure 4:
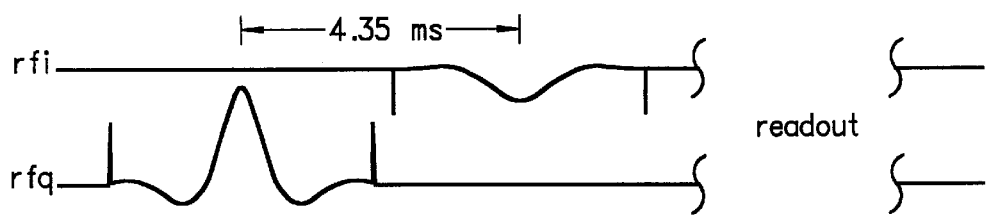
FIG. 4 illustrates in-phase and quadrature components of an RF waveform for $B_1$ mapping sequence.

FIG. 4 illustrates the $B_1$ mapping sequence, which is repeated twice with the center frequency of the second repetition offset by $f_{off}$. The sequence is then repeated a third time with the amplitude of the $2\alpha$ pulse set to zero, to establish a zero phase reference which is subtracted from the phase of the first two acquisitions. A rapid $B_0$ mapping sequence is then used to obtain a map of off-resonance phase accrual $\theta$. The phase angle $\beta$ of the first acquisition is used to determine $\alpha$ for those points in the imaging plane with off-resonance frequency such that $\theta$ falls in the range −45° to 45° or from 135° to 225°, while the phase angle $\beta$ of the second acquisition is used to determine $\alpha$ for all other points in the imaging plane, for which $\theta$ falls in the range of 45° to 135° or 225° to 315°.

The above analysis has assumed pulses of zero duration. Simulation of the actual pulse sequence illustrated in FIG. 4 by numerical integration of the Bloch equation with pulse lengths of 4 ms shows excellent agreement with the above theoretical results.

If the $2\alpha$ and $\alpha$ excitation pulses have zero duration, as was assumed in the above analysis, then $\tau$ can be made zero. Then the off-resonance phase $\theta$ is zero, and only one acquisition of $M_{xy}$ is necessary. In practice, I set $\tau=4.35$ ms, the reciprocal of the frequency difference between fat and water, and obtain two measurements of $M_{xy}$ with separate imaging sequence repetitions whose excitation and acquisition center frequencies vary by $f_{off}=57$ Hz. By spacing the two excitation pulses by 4.35 ms, we ensure that the transverse magnetizations of both fat and water created by the initial $2\alpha$ pulse will be in phase with each other when the $\alpha$ excitation is applied. In other words, if the off-resonance phase accrual by water between the $2\alpha$ and $\alpha$ pulses in a given voxel is $\theta$, the off-resonance phase accrual by fat in the same voxel will be $\theta-360°$.

For clarity, the method has been presented above as a series of two excitation pulses about orthogonal axes. From the point of view of spins at an off-resonance frequency resulting in a phase accrual $\theta$ of 90°, the second excitation pulse appears to be along the same axis as the first. In fact, the $B_1$ mapping method presented above may be implemented as a series of two excitations about the same axis by simply offsetting the center frequency of excitation and readout by a frequency corresponding to a phase accrual of 90°.

Figure 5A:
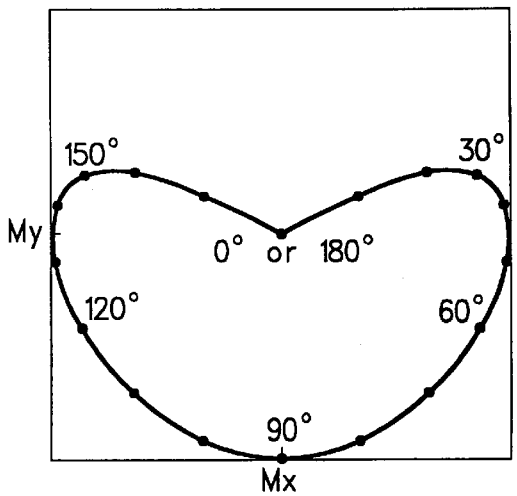
FIGS. 5A, 5B illustrate theoretical transverse magnetization for precession of 0 from 10° to 170° and a range flip angle α from 0° to 180°, using two successive coaxial flips.
Figure 5B:
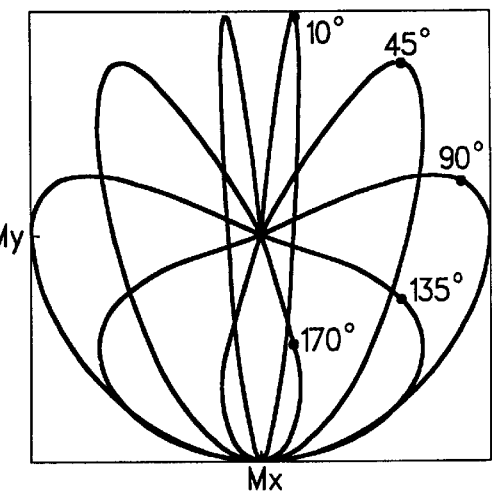

For a $2\alpha$ excitation about $\hat{x}$ followed by an $\alpha$ excitation about $\hat{x}$, the resulting transverse magnetization $M_{xy}$ is $M_x=d_2 \sin 2\alpha \sin \theta$
$M_y=d_2 \sin 2\alpha \cos \alpha \cos \theta+\sin \alpha(\cos 2\alpha+d_1 (1-\cos 2\alpha))$
$M_z=\cos \alpha(\cos 2\alpha+d_1 (1-\cos 2\alpha))-d_2 \sin 2\alpha \sin \alpha \cos \theta$ Neglecting relaxation effects, $M_x=\sin 2\alpha \sin \theta$
$M_y=\sin 2\alpha \cos \alpha \cos \theta+\cos 2\alpha \sin \alpha$
$M_z=\cos 2\alpha \cos \alpha-\sin 2\alpha \sin \alpha \cos \theta$ This transverse magnetization is plotted in FIG. 5A for $\alpha$ from 0° to 180° and $\theta=90°$. FIG. 5 shows $M_{xy}$ for $\alpha$ from 0° to 180° for a few values of $\theta$ from 10° to 170°. In FIG. 5A theoretical transverse magnetization for sequence implementation is with two successive flips about $\hat{x}$ for $\theta=90°$ and with discrete points plotted at 10° increments of $\alpha$, and in FIG. 5B, $\theta$ ranges from 10° to 170° with discrete points plotted for $\alpha=30°$. These results resemble the transverse magnetization created by the method of orthogonal excitations described above, which was shown in FIG. 1. The only difference is an offset of 90° in $\theta$.

Figure 6:
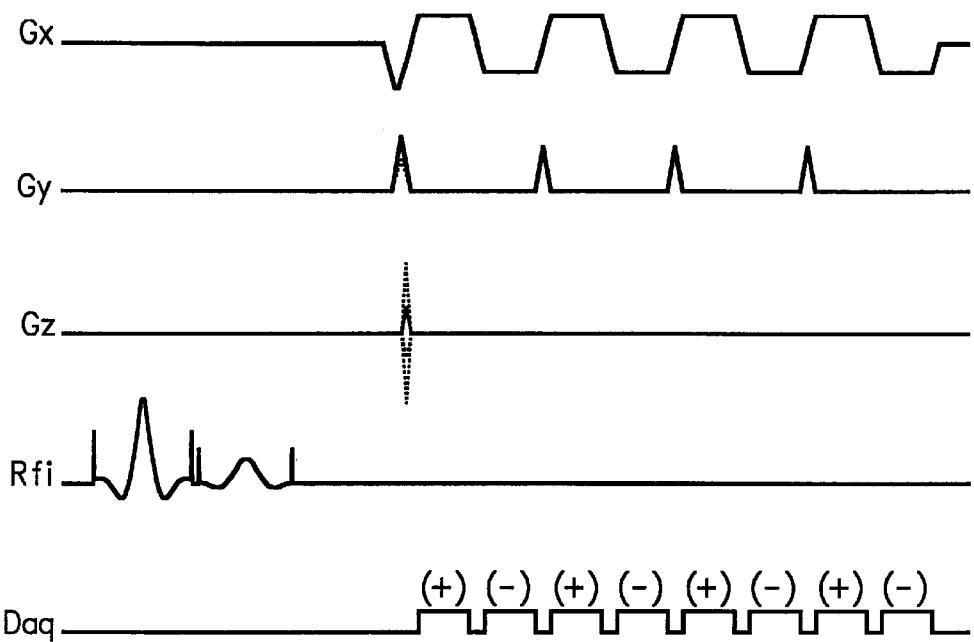
FIG. 6 illustrates an echo-planar pulse sequence using two excitations about the same axis with three-dimensional echo-planar data acquisition.

The method described above was implemented as illustrated in FIG. 6, with spatially non-selective $2\alpha$ and $\alpha$ pulses about the same axis, in connection with a three-dimensional echo-planar acquisition scheme. Echo-planar pulse sequence is shown using two excitations about the same axis with three-dimensional echo-planar acquisition. Gx, Gy, and Gx are gradient waveforms, Rfi is the time envelope of the RF excitation. Daq shows integrals of data acquisition. Intervals labeled (+) and (−) indicate positive and negative direction of transversal of $k_x$ space. Echo-planar readout was in the x direction with phase encoding blips in both the y and z directions. For ease of implementation, the echo-planar acquisition utilized a fly-back scheme in which successive lines of $k_x$-space were obtained in both the positive and negative directions between each phase encoding blip in $k_y$, resulting in two separate images, one of which was discarded. This simple approach, though inefficient, eliminates many potential phase problems of echo-planar reconstruction.

Figure 7A:
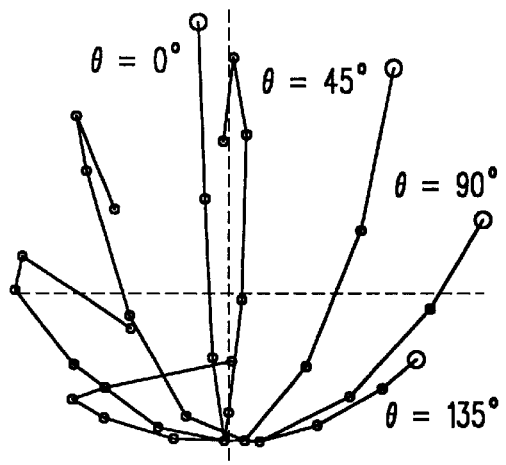
FIGS. 7A, 7B illustrate experimentally measured transverse magnetization for α from 30° to 150° and for various precession angles and a $B_1$ map for one plane of a spherical phantom.
Figure 7B:
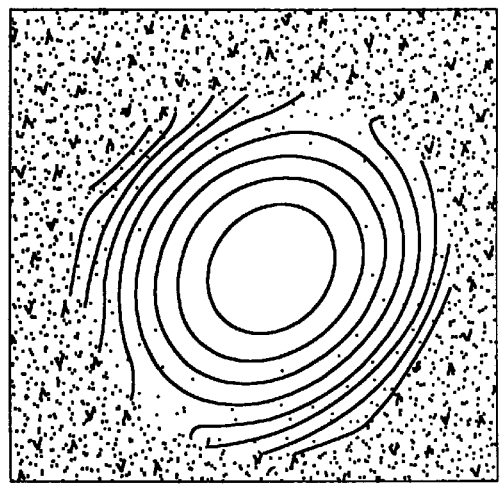

FIG. 7B shows a single plane from a three-dimensional $B_1$ map of a water-filled phantom occupying most of the volume of a head coil. Total image resolution was 32×32× 32. Four lines of k-space were acquired with each acquisition. Contour lines are superimposed on the $B_1$ map at 5° flip angle intervals. The map shows a total range of flip angles from 55° to 100°.

FIG. 7A shows the transverse magnetization at individual points in the phantom with varying values (0°, 45°, 90°, 135°) of off-resonance phase θ as the flip angle was varied between 30° and 150° in 15° increments. Comparison of this figure with FIG. 5 shows good agreement between the theoretical transverse magnetization and the actual measured magnetization.

The results shown in the previous section were obtained using non-selective pulses and a three-dimensional acquisition scheme. In theory, the method could be implemented in a slice-selective manner. In practice, slice profile effects such as through-slice signal averaging and non-linearities in the excitation process make this difficult.

In a slice-selective implementation, the signal received from any point (x,y) in the imaging plane is the vector integral over z through the thickness of the slice, including transition bands where the flip angle varies from zero to the nominal flip angle. Signal from the transition bands of the slice profile corrupts the phase information on which the flip angle estimate is based. This is especially true for slice-selective pulses with flip angles greater than 90°, since a flip angle of 90° will be achieved at some point in the transition band of the slice profile.

A slice-selective implementation suffers from the non-linear nature of excitation. It is tempting to assume that the slice profile of a 2α pulse is simply the slice profile of an α pulse scaled by a factor of $\sin(\alpha)/\sin(2\alpha)$. This condition holds approximately for small tip angles. However, for tip angles 2α greater than about 90°, the slice profile of a 2α pulse varies significantly from that of an α pulse.

Through-slice averaging and non-linearity of excitation would adversely affect the performance of a slice-selective implementation of our $B_1$ mapping method. These effects could be somewhat ameliorated by using a lookup scheme for estimating flip angle from phase information, rather than the closed-form solution given in Eq. 2. The phase β could be simulated by numerical integration of the Block equation for a slice-selective implementation for a range of values of actual flip angle α, and these values of β vs. α could be used as a lookup table to estimate α from β. Such an approach might remove the effects of through-slice averaging and non-linearity of excitation, but rely on the accuracy of numerical simulation.

The two methods of Insko et al, supra, are immune to the problem of integration across a slice profile but suffer from non-linearity of excitation. Since excitation is non-linear, the slice profile of the initial α or 2α pulse used in this method does not correspond to the slice profile of the subsequent 2α or 4α pulse, and errors are introduced.

Topp's method, supra, is immune to through-slice averaging and non-linearity of excitation. Integration over the slice profile does not introduce errors since, regardless of the flip angle at any point in the transition band of the slice profile, the four acquisitions still differ only by the factor of cos θ. Since the same α pulse is used three times to form the stimulated echo, its slice profile is identical each time it is used in the pulse sequence, so non-linearity of excitation has no adverse effect. For these reasons, Topp's method lends itself easily to slice-selective application.

The present invention requires three separate acquisitions (a phase reference acquisition and two phase acquisitions with differing center frequency) plus the acquisition of a main field ($B_0$) map. The methods proposed by Insko et al. require only two acquisitions, requiring about half the scan time of our method. The method of Topp et al. requires four acquisitions, requiring roughly the same imaging time as our method.

Repetition time is an important factor in total imaging time. If a large dephasing gradient is prepended to the pulse sequence used in our method, the sequence may be repeated as rapidly as desired without introducing errors in the measured phase from which the flip angle is estimated. In other words, the effects of initial transverse magnetization sum to zero if the initial transverse magnetization itself sums to zero over one of the voxel dimensions. The methods of Insko and Topp share this property. However, all of these methods also result in a longitudinal magnetization which may be zero or less than zero for some flip angles and/or values of main field inhomogeneity. Thus, to prevent drastic loss of SNR, it is necessary with all of these mapping methods to use a repetition time somewhat greater than the $T_1$ of the sample.

Corruption of the received signal with noise causes inaccuracy of the flip angle estimate for any $B_1$ mapping method. The four $B_1$ mapping methods previously mentioned are now compared in terms of their robustness to noise. The results presented are based on an assumption of Gaussian white noise corrupting both channels of a quadrature receiver. Details of the derivation of the probability density function (pdf) of the flip angle estimate for each method are given in Appendix A. The noise characteristics of each measurement method are characterized in terms of three variables: the probability of an ambiguous measurement, the mean bias of the flip angle estimate, and the standard deviation of the estimate.

In my phase-sensitive method of $B_1$ mapping, noise corruption may cause a phase measurement that does not correspond to any flip angle. For example, with reference to FIG. 5, a measured phase between about 45° and 135° would be outside the range of possible phase corresponding to any flip angle. Such measurements could be assigned to the nearest flip angle (i.e. zero to 180°), or could be simply designated as invalid.

In Insko's two methods of $B_1$ mapping, noise corruption may cause the ratio of the two acquisitions to fall out of the range corresponding to real flip angles. Such ambiguous measurements could be assigned to the nearest flip angle, i.e., zero, or could be designated invalid.

I have disregarded ambiguous measurements in the calculation of mean bias and standard deviation for the plots which follow. The mean bias and standard deviation of the estimate of the flip angle would be different if ambiguous measurements were assigned to a flip angle.

Figure 8:
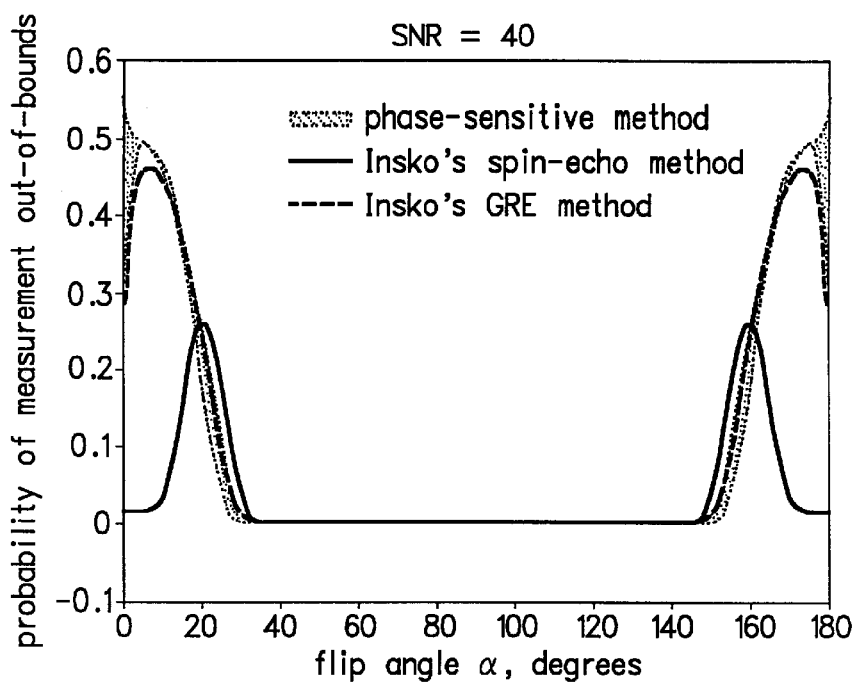
FIG. 8 illustrates probability of an ambiguous "out-of-bounds" measurement for three $B_1$ mapping methods at SNR of 40.
Figure 9:
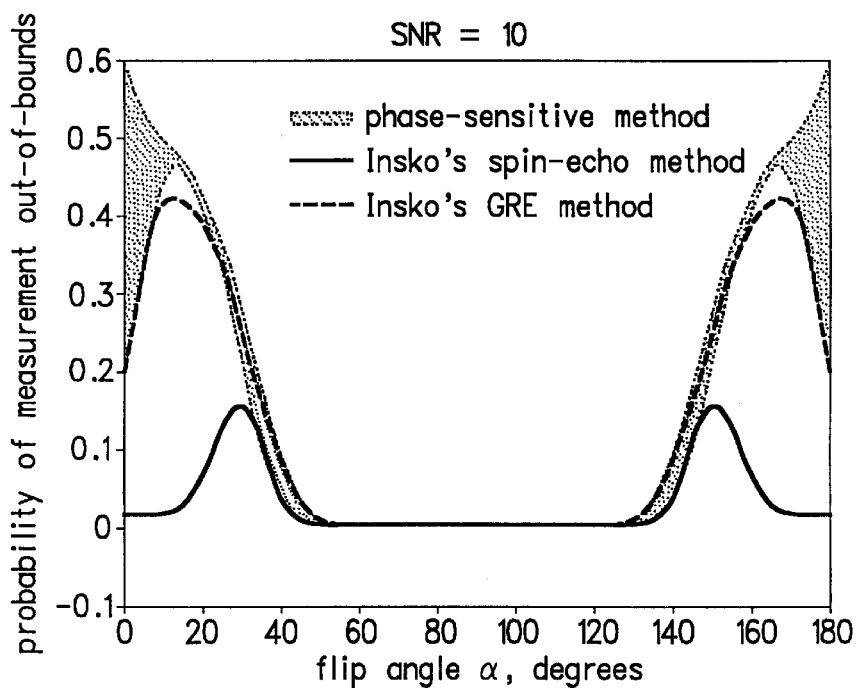
FIG. 9 illustrates probability of an ambiguous "out-of-bounds" measurement for three $B_1$ mapping methods at SNR of 10.

FIG. 8 shows the probability of an ambiguous measurement for our phase-sensitive method and both of Insko's methods for a system with SNR of 40. The probability of ambiguous measurements in our phase-sensitive method is a function of the off-resonance phase angle θ, and varies over a certain range for each value of flip angle α. This is indicated in FIG. 8 by the shaded areas, which indicates the range of possible probabilities over the range of possible off-resonance angles θ. FIG. 8 shows that the probability of ambiguous measurement becomes substantial for flip angles below about 35° or above 145° for all of the mapping methods. FIG. 9 shows the same result for a system with lower SNR of 10.

In Topp's method, in which a curve-fitting algorithm is used to fit observations to a cosine wave, no measurement can be considered "out-of-bounds," though noise-corrupted measurements will lead to a worse fit. If noise corruption becomes too extreme, the curve-fitting algorithm fails to converge. Though not quantified here, our experience is that failure to converge becomes a problem for flip angles less than about 35° or greater than 145° for the case of SNR of 40, and for flip angles less than about 40° or greater than about 130° for the case of SNR of 10, roughly paralleling the increasing of ambiguous measurement in the other imaging methods.

Figure 10:
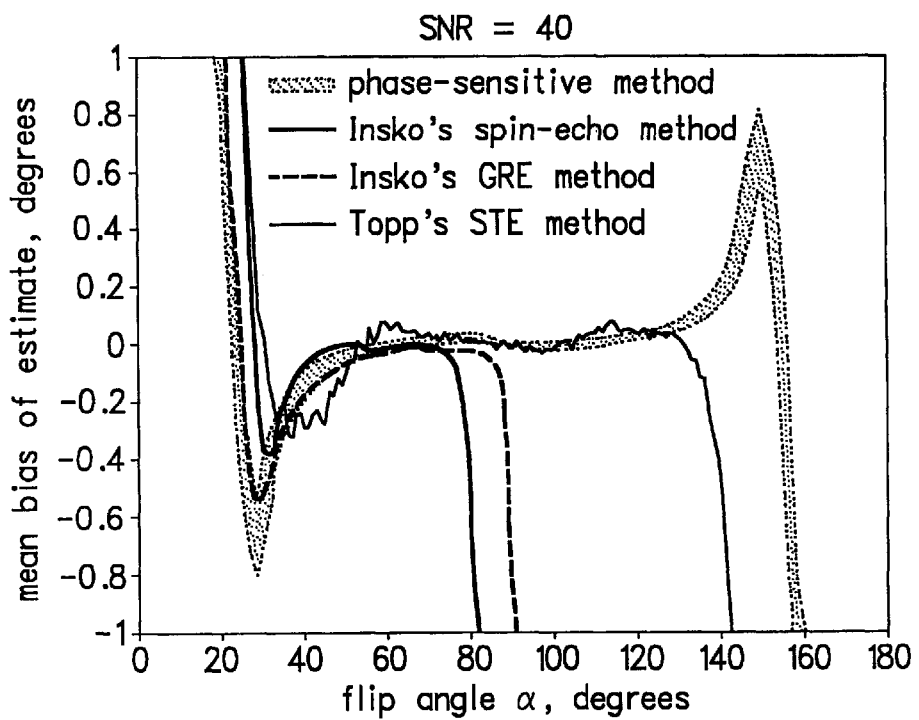
FIG. 10 illustrates mean bias for four $B_1$ imaging methods at SNR of 40.
Figure 11:
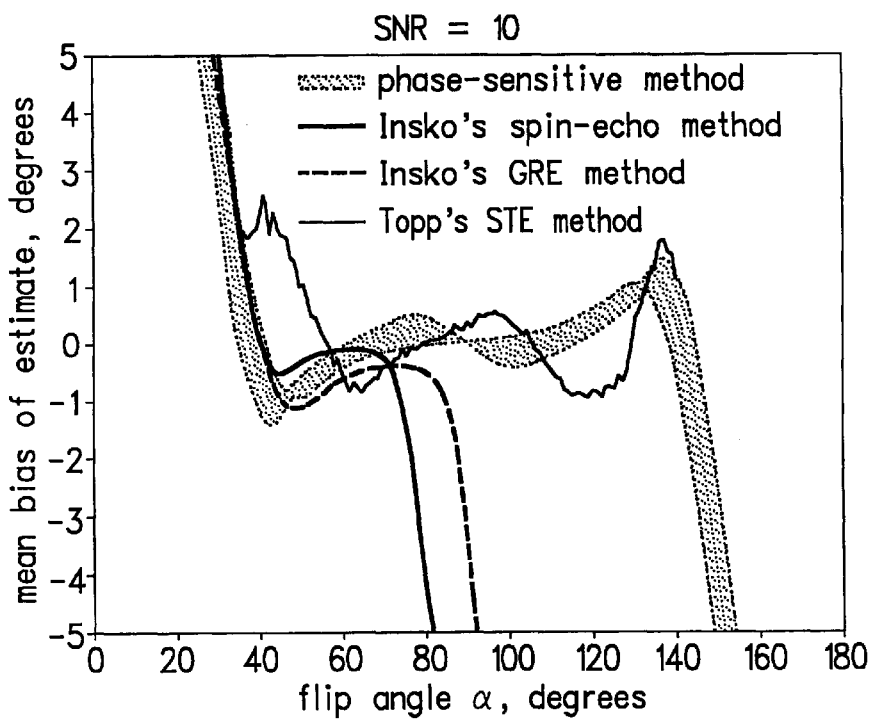
FIG. 11 illustrates mean bias for four $B_1$ imaging methods at SNR of 10.

FIGS. 10 and 11 show the bias in the mean of the pdf of the flip angle estimates obtained by each method of SNR of 40 and 10. Mean bias limits the usefulness of Insko's method of spin echoes to a range of flip angles from about 30° to 80°. Insko's GRE method has a useful range of about 30° to 90°. The rapidly increasing mean bias of Insko's methods as the flip angle approaches 90° reflects the fact that these methods are designed for a range of flip angle from 0° to 90°; flip angles from 90° to 180° result in magnitude ratios identical to those from 90° to 0°.

Figure 12:
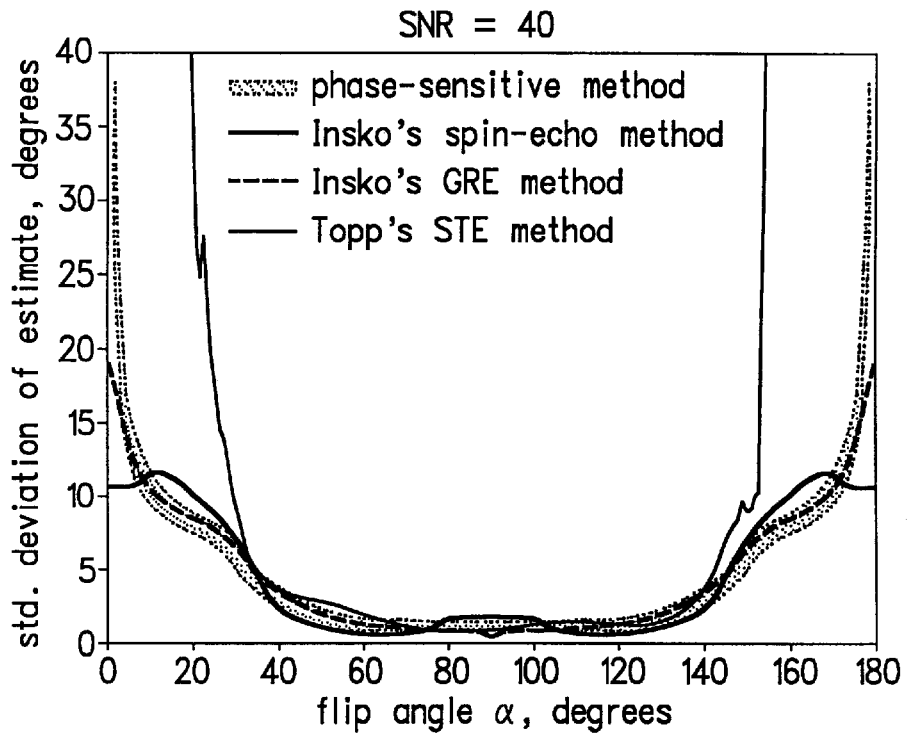
FIGS. 12, 13 are standard deviation of estimates of flip angle for four imaging methods at SNR of 40 and of 10, respectively.
Figure 13:
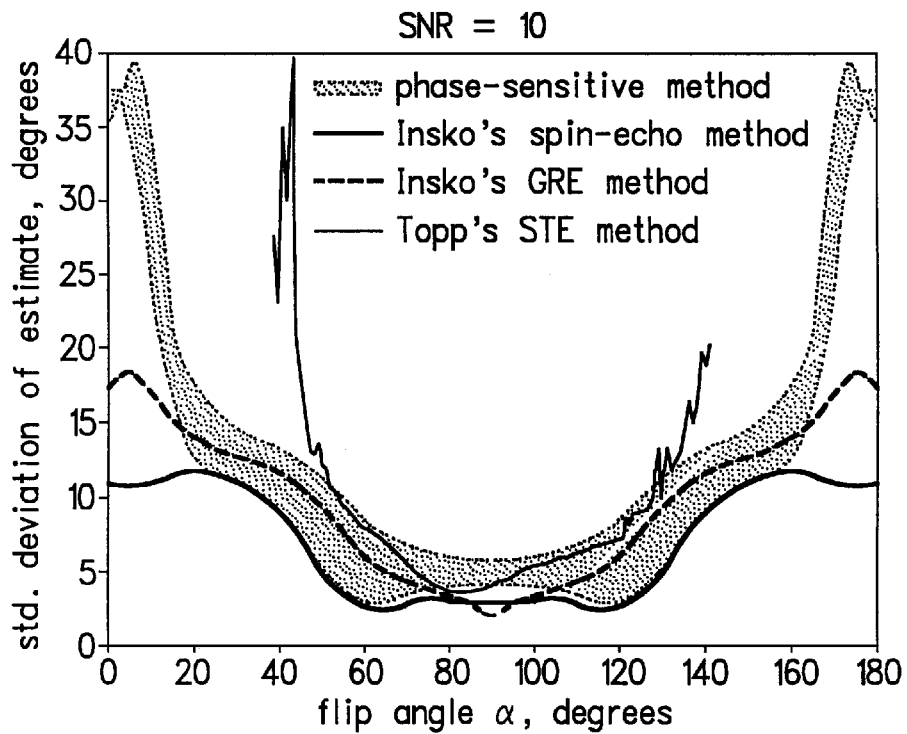

The mean bias shown for Topp's method was derived from Monte Carlo simulation, and FIGS. 12 and 13 show the standard deviation of the flip angle estimate for the four imaging methods for system SNR of 40 and 10. The lowest standard deviation is achieved by Insko's method of spin-echoes over the range of about 30° to 80° in which it is valid. Mean bias renders its invalid outside of this range. Insko's GRE method also has very favorable standard deviation over its wider range of usefulness from about 30° to 90°. The standard deviation of our phase sensitive method and Topp's method are roughly comparable over their useful range of about 30° to 150° for SNR of 40 and about 40° to 140° for SNR of 10.

Figure 14:
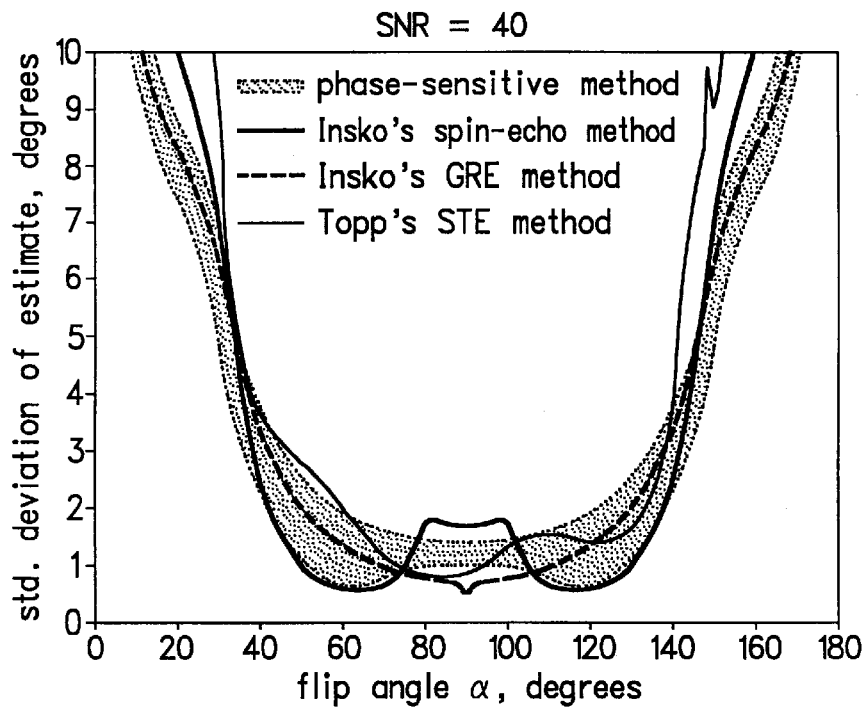
FIGS. 14, 15 are zoomed views of standard deviation of estimates of flip angle for four imaging methods at SNR of 40 and of 10, respectively.
Figure 15:
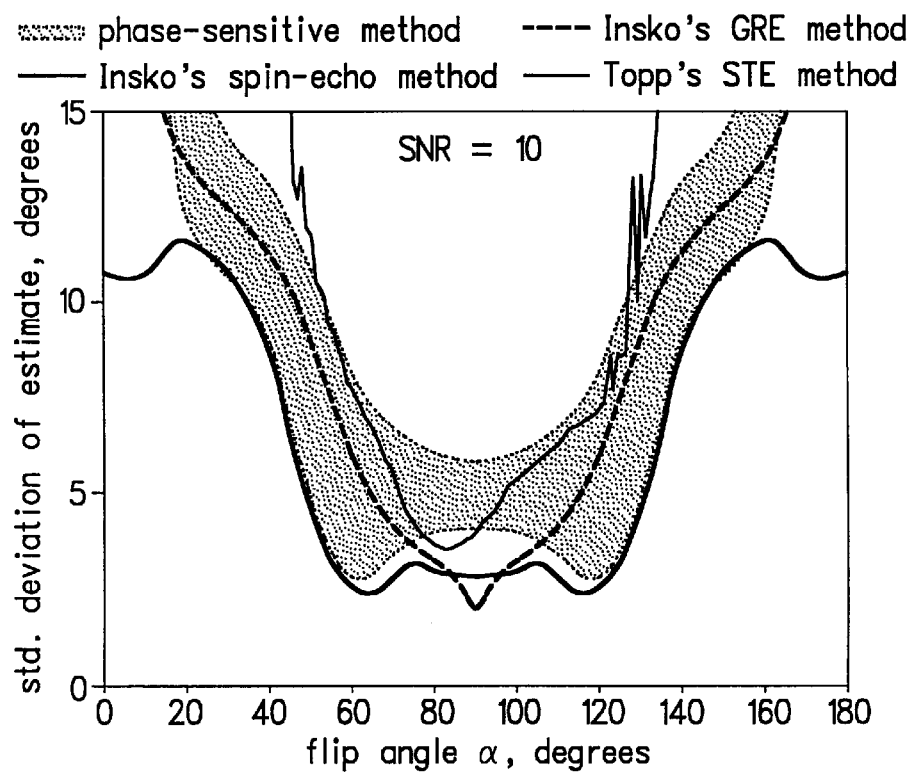

FIGS. 14 and 15 show more detail of the same plots shown in FIGS. 12 and 13.

There has been presented a phase-sensitive method of $B_1$ mapping which is useful over a wide range of flip angles. This method can be useful in mapping the sensitivity of surface receiver coils for image intensity correction. It can also be especially applicable to situations where surface coils are used for RF excitation, such as open-bore interventional magnets. While the invention has been described with reference to specific embodiments, the description is illustrative of the invention and is not to be construed as limiting the invention. Various modifications and applications will be obvious to those skilled in the art without departing from the true spirit and scope of the invention as defined by the appended claims.

What is claimed is:

1. A phase-sensitive method of radio-frequency field mapping for magnetic resonance imaging comprising the steps of:
   a) placing an object in a static magnetic field ($B_0$) along an axis (z),
   b) applying a first RF excitation pulse with flip angle $2\alpha$ about an axis($\hat{x}$),
   c) applying a second RF excitation pulse with flip angle $\alpha$ about another axis ($\hat{y}$),
   d) obtaining transverse magnetization $M_{xy}=M_x+iM_y$,
   e) determining phase angle, $\beta$, as $\tan^{-1}(M_y/M_x)$, and
   f) using $\beta$ as a phase sensitive function of $\alpha$ to map the radio frequency field.

2. The method as defined by claim 1 and further including repeating steps b) through f) with RF excitation pulses offset by a frequency $f_{off}$, such that during the time interval, $\tau$, between steps (b) and (c) $f\tau=90°$, step f) from the first sequence providing a RF field measurement of $\alpha$ with off-resonance frequency such that transverse magnetization precession, $\theta$, due to off-resonant frequency of spins during time interval, $\tau$, falls in the range of −45° to +45° or from 135° to 225°, step f) from the second sequence providing a RF field measurement such that $\theta$ falls in the range of 45° to 135° or 225° to 315°.

3. The method as defined by claim 2 wherein transverse magnetization precession is obtained from a $B_0$ field map.

4. The method as defined by claim 3 and further including the steps of:
   g) applying a 90° excitation RF pulse,
   h) obtaining a reference transverse magnetization, and
   i) subtracting the reference transverse magnetization from the measurements in step d) to remove phase effects of eddy currents and data acquisition delays.

5. The method as defined by claim 1 and further including the steps of:
   g) applying a 90° excitation RF pulse.
   h) obtaining a reference transverse magnetization, and
   i) subtracting the reference transverse magnetization from the measurements in step d) to remove phase effects of eddy currents and data acquisition delays.

6. A phase-sensitive method of radio-frequency field mapping for magnetic resonance imaging comprising the steps of:
   a) placing an object in a static magnetic field ($B_0$) along an axis (z),
   b) applying a first RF excitation pulse with flip angle $2\alpha$ about an axis ($\hat{x}$),
   c) applying a second RF excitation pulse with flip angle $\alpha$ about the same axis ($\hat{x}$),
   d) obtaining transverse magnetization $M_{xy}=M_x+iM_y$,
   e) determining phase angle $\beta$, as $\tan^{-1}(M_y/M_x)$, and
   f) using $\beta$ as a phase sensitive function of $\alpha$ to map the radio frequency field.

7. The method as defined by claim 6 and further including repeating steps b) through f) with RF excitation pulses offset by a frequency $f_{off}$, such that during the time interval, $\tau$, between stops (b) and (c) $f\tau=90°$, step f) from the first sequence providing a RF field measurement of $\alpha$ with off-resonance frequency such that transverse magnetization precession, $\theta$, due to off-resonant frequency of spins during time interval, $\tau$, falls in the range of 45° to 135° or from 225° to 315°, step f) from the second sequence providing a RF field measurement such that $\theta$ falls in the range of −45° to 45°.

8. The method as defined by claim 7 wherein transverse magnetization precession is obtained from a $B_0$ field map.

9. The method as defined by claim 8 and further including the steps of:
   g) applying a 90° excitation RF pulse,
   h) obtaining a reference transverse magnetization, and
   i) subtracting the reference transverse magnetization from the measurements in step d) to remove phase effects of eddy currents and data acquisition delays.

* * * * *